(12) United States Patent
Kiuchi et al.

(10) Patent No.: US 11,486,931 B2
(45) Date of Patent: Nov. 1, 2022

(54) BATTERY CAPACITY ESTIMATION DEVICE, BATTERY CAPACITY ESTIMATION METHOD, AND COMPUTER PROGRAM PRODUCT

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Masako Kiuchi, Fuchu Tokyo (JP); Mami Mizutani, Hachioji Tokyo (JP); Kenji Mitsumoto, Kawasaki Kanagawa (JP); Noriyuki Yamagishi, Sendai Miyagi (JP); Toshiyuki Seto, Sendai Miyagi (JP); Kenichi Wakasugi, Sendai Miyagi (JP)

(73) Assignees: KABUSHIKI KAISHA TOSHIBA, Tokyo (JP); TOSHIBA ENERGY SYSTEMS & SOLUTIONS CORPORATION, Tokyo (JP)

( * ) Notice: Subject to any disclaimer, the term of this patent is extended or adjusted under 35 U.S.C. 154(b) by 130 days.

(21) Appl. No.: 16/936,741

(22) Filed: Jul. 23, 2020

(65) Prior Publication Data
US 2021/0055351 A1 Feb. 25, 2021

(30) Foreign Application Priority Data
Aug. 21, 2019 (JP) .............................. JP2019-151431

(51) Int. Cl.
*G01R 31/36* (2020.01)
*H02J 7/04* (2006.01)
(Continued)

(52) U.S. Cl.
CPC ....... *G01R 31/3648* (2013.01); *G01R 31/367* (2019.01); *H02J 7/04* (2013.01); *H02J 7/35* (2013.01)

(58) Field of Classification Search
CPC .............. G01R 31/3648; G01R 31/367; G01R 31/3842; H02J 7/04; H02J 7/35; H02J 3/32; H02J 7/0048
See application file for complete search history.

(56) References Cited

U.S. PATENT DOCUMENTS 11,233,207 B2 * 1/2022 Seifrid ................ H01L 51/0071
2010/0244845 A1 * 9/2010 Morikawa .............. G01R 19/25
324/427

(Continued)

FOREIGN PATENT DOCUMENTS

JP 5419832 B2 2/2014
JP 5461668 B1 4/2014

*Primary Examiner* — Stacy Whitmore
(74) *Attorney, Agent, or Firm* — Finnegan, Henderson, Farabow, Garrett & Dunner, LLP

(57) ABSTRACT

A battery capacity estimation device in an embodiment includes one or more hardware processors configured to: acquire an alternating current power or an alternating current energy that is input to and output from a storage battery system via a direct current-alternating current converter, the storage battery system being capable of controlling charge and discharge; acquire a state of charge (SoC) of the storage battery system; and estimate a battery capacity of the storage battery system based on the acquired alternating current power or the acquired alternating current energy and the acquired SoC.

6 Claims, 12 Drawing Sheets

(51) Int. Cl.
*H02J 7/35* (2006.01)
*G01R 31/367* (2019.01)

(56) References Cited

U.S. PATENT DOCUMENTS

| | | | | |
|---|---|---|---|---|
| 2012/0259723 | A1* | 10/2012 | Ansari | H02J 3/383 |
| | | | | 705/26.3 |
| 2013/0179061 | A1* | 7/2013 | Gadh | B60L 55/00 |
| | | | | 701/123 |
| 2016/0025814 | A1* | 1/2016 | Ide | G01R 31/396 |
| | | | | 324/432 |
| 2017/0338668 | A1* | 11/2017 | Sada | H01M 10/443 |
| 2018/0175660 | A1* | 6/2018 | Hara | H02J 7/0068 |
| 2018/0248376 | A1* | 8/2018 | Teramoto | H02J 7/0014 |
| 2018/0331537 | A1* | 11/2018 | Watanabe | H02J 3/14 |
| 2020/0191876 | A1* | 6/2020 | Shin | G01R 31/3835 |
| 2020/0220363 | A1* | 7/2020 | Marquet | H02J 7/0069 |
| 2021/0036544 | A1* | 2/2021 | Cao | G06F 1/263 |

* cited by examiner

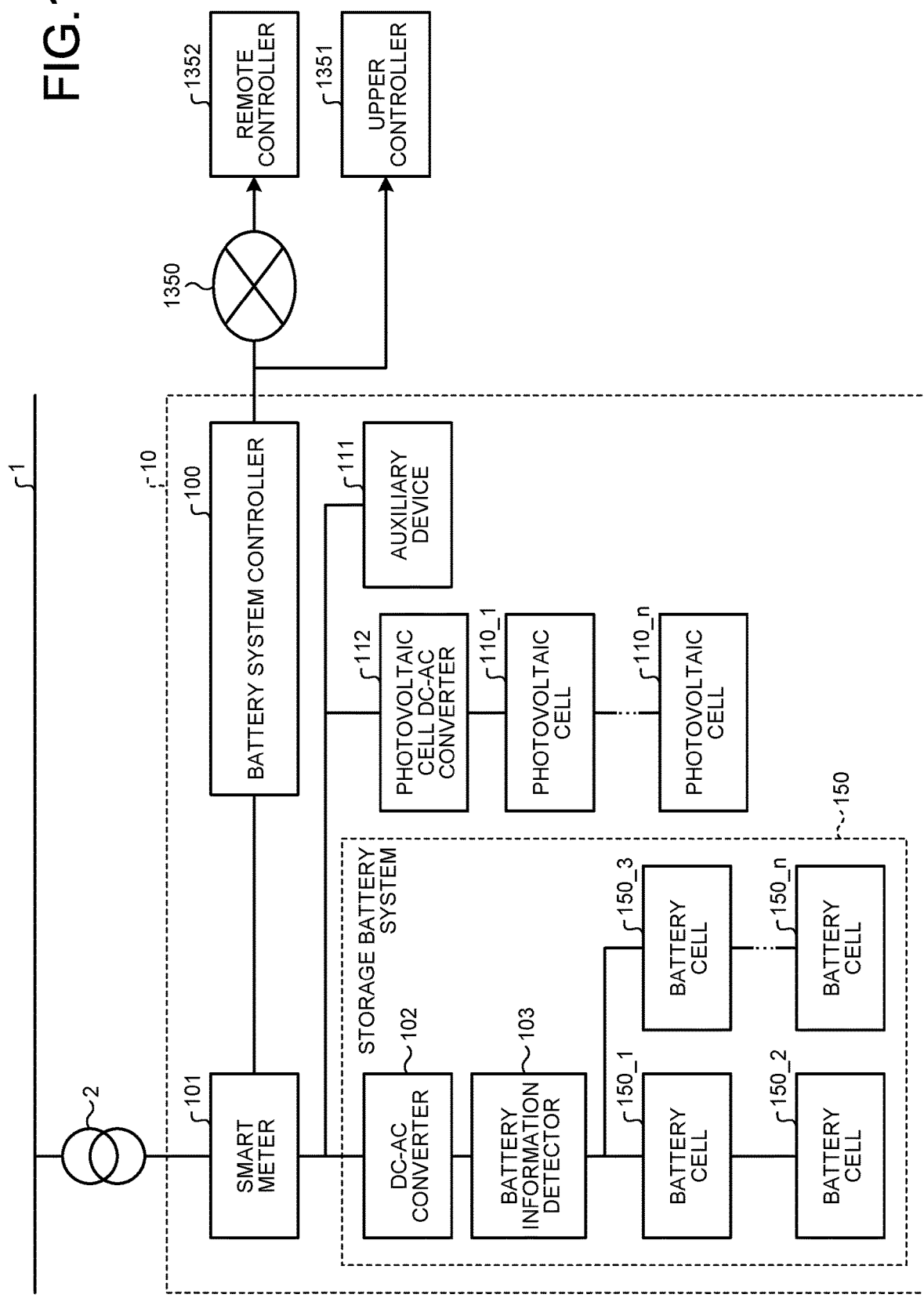

BATTERY CAPACITY ESTIMATION DEVICE, BATTERY CAPACITY ESTIMATION METHOD, AND COMPUTER PROGRAM PRODUCT

This application is based upon and claims the benefit of priority from Japanese Patent Application No. 2019-151431, filed Aug. 21, 2019, the entire contents of which are incorporated herein by reference.

FIELD

Embodiments described herein relate generally to a battery capacity estimation device, a battery capacity estimation method, and a computer program product.

BACKGROUND

In recent years, the use of storage battery systems using secondary batteries has been expanded. The storage battery systems are used for moving bodies such as electric automobiles, fluctuation suppression of renewable energy, peak shift or demand response of recent power demand, and power buffering by power generation business operators under electricity deregulation, for example.

The secondary batteries included in such storage battery systems deteriorate in years elapsed from start of introduction of the storage battery systems and depending on the operation methods.

The deterioration of the secondary batteries includes internal resistance deterioration with an increase in internal resistance and capacity deterioration with a decrease in capacity (effective capacity) capable of being charged in and discharged from the secondary batteries. Particularly, it is preferable that the capacity deterioration with a decrease in the effective capacity be appropriately grasped because the capacity deterioration influences on the storage battery system operation. Examples of the conventional techniques are Japanese Patent No. 5419832 and Japanese Patent No. 5461668.

In the conventional techniques, the effective capacity is estimated on the basis of information on a direct current (DC) current side, the information being directly input to and output from the storage battery system.

Users who intend to control power tend to acquire information about power on an alternating current (AC) current side after a DC-AC converter by using a smart meter, for example.

The storage battery systems are usually used by being connected to an AC system. Virtual power plants (VPPs) and power business operators who manage storage battery systems in a group to operate the storage battery systems in a power conditioning market cannot obtain the information about the storage battery system before the DC-AC converter. As a result, it is difficult to estimate the effective capacity.

BRIEF DESCRIPTION OF THE DRAWINGS

FIG. 13 is a diagram exemplarily illustrating a structure of a power control system according to a fifth embodiment.

DETAILED DESCRIPTION

According to one embodiment, a battery capacity estimation device includes one or more hardware processors configured to: acquire an alternating current power or an alternating current energy that is input to and output from a storage battery system via a direct current-alternating current converter, the storage battery system being capable of controlling charge and discharge; acquire a state of charge (SoC) of the storage battery system; and estimate a battery capacity of the storage battery system based on the acquired alternating current power or the acquired alternating current energy and the acquired SoC.

The following describes embodiments with reference to the accompanying drawings. The structures of the following described embodiments and the operations and results (effects) provided by the structures are only presented by way of example only, and are not limited to those described below.

First Embodiment

Figure 1:
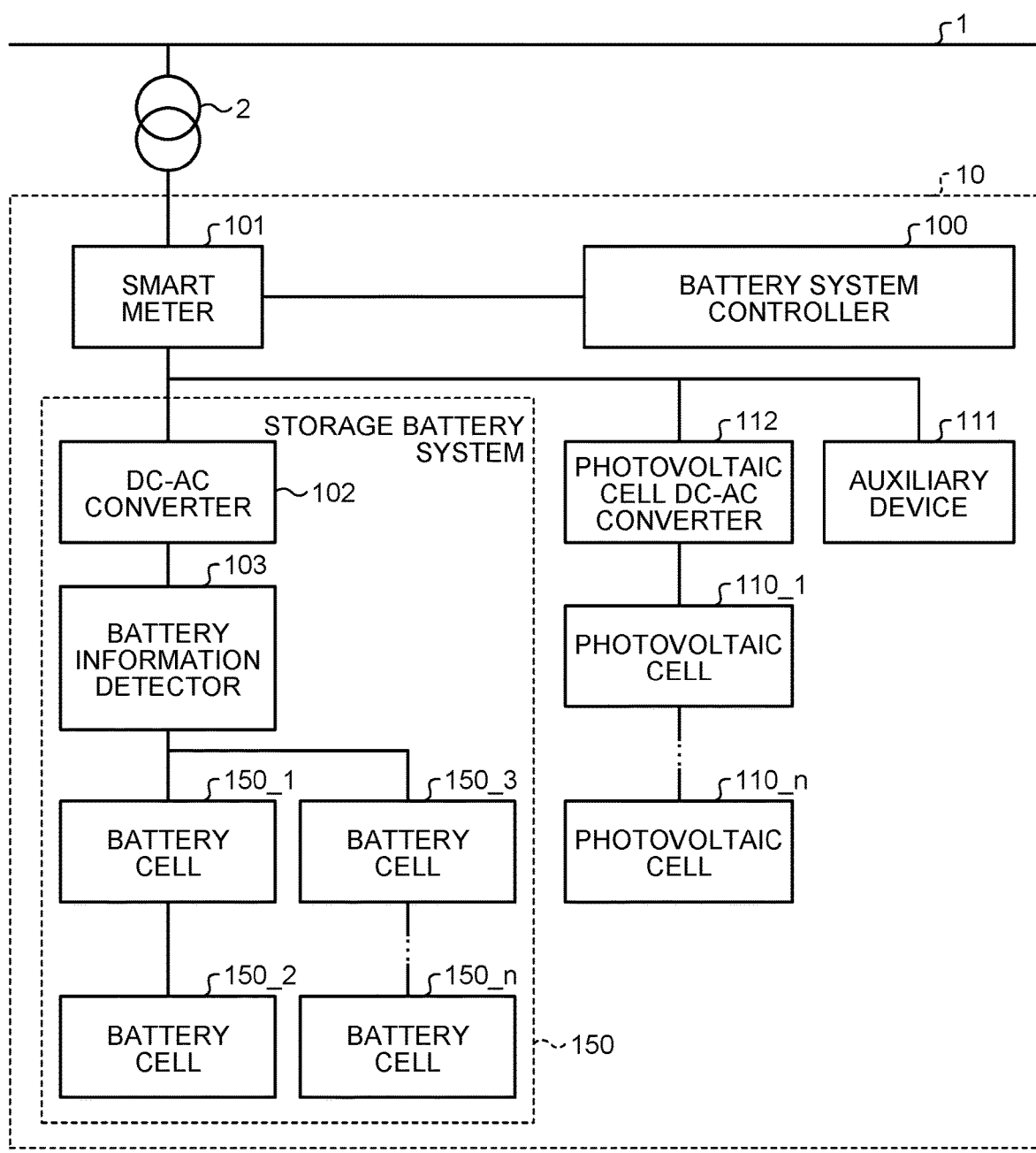
FIG. 1 is a diagram exemplarily illustrating a structure of a power control system according to a first embodiment.

FIG. 1 is a diagram exemplarily illustrating a structure of a power control system according to a first embodiment. As illustrated in FIG. 1, a power control system 10 is connected to a power system 1 via a transformer 2. The power control system according to the first embodiment is an example to which a battery capacity estimation device, a battery capacity estimation method, and a computer program product are applied.

The power control system 10 includes a battery system controller 100 to which the battery capacity estimation device is applied, a smart meter 101, a photovoltaic cell direct current (DC)-alternating current (AC) converter 112, photovoltaic cells 110_1 to 110_n, an auxiliary device 111, and a storage battery system 150. The storage battery system 150 includes a DC-AC converter 102, a battery information detector 103, and battery cells 150_1, 150_2, 150_3, ..., and 150_n. The battery information detector 103 detects information (e.g., a state of charge (SoC)) about the storage battery system 150 from each of the battery cells 150_1, 150_2, 150_3, ..., and 150_n of the storage battery system 150. The information about the storage battery system 150 detected by the battery information detector 103 may be transmitted to the battery system controller 100 or the smart meter 101.

As illustrated in FIG. 1, DC currents discharged from the battery cells 150_1 to 150_n are converted into an AC current via the DC-AC converter 102. A current input from the power system 1 via the transformer 2 and an AC current converted from DC currents via the photovoltaic cell DC-AC converter 112 after generation by the photovoltaic cells 110_1 to 110_n are converted into a DC current via the DC-AC converter 102. Thereafter, the DC current is charged in the battery cells 150_1 to 150_n.

The smart meter 101 can detect a current, and a power or an energy that are charged in and discharged from the storage battery system 150 by a current detection device (not illustrated) and a voltage detection device (not illustrated) that are included in the smart meter 101. Herein, the energy means a power used per a certain time. The smart meter 101 can also detect a current, and a power or an energy that are charged in and discharged from the storage battery system 150 via the DC-AC converter 102.

The battery system controller 100 acquires the information about the storage battery system 150 from the battery information detector 103 or the smart meter 101 to control the storage battery system 150.

Figure 2:
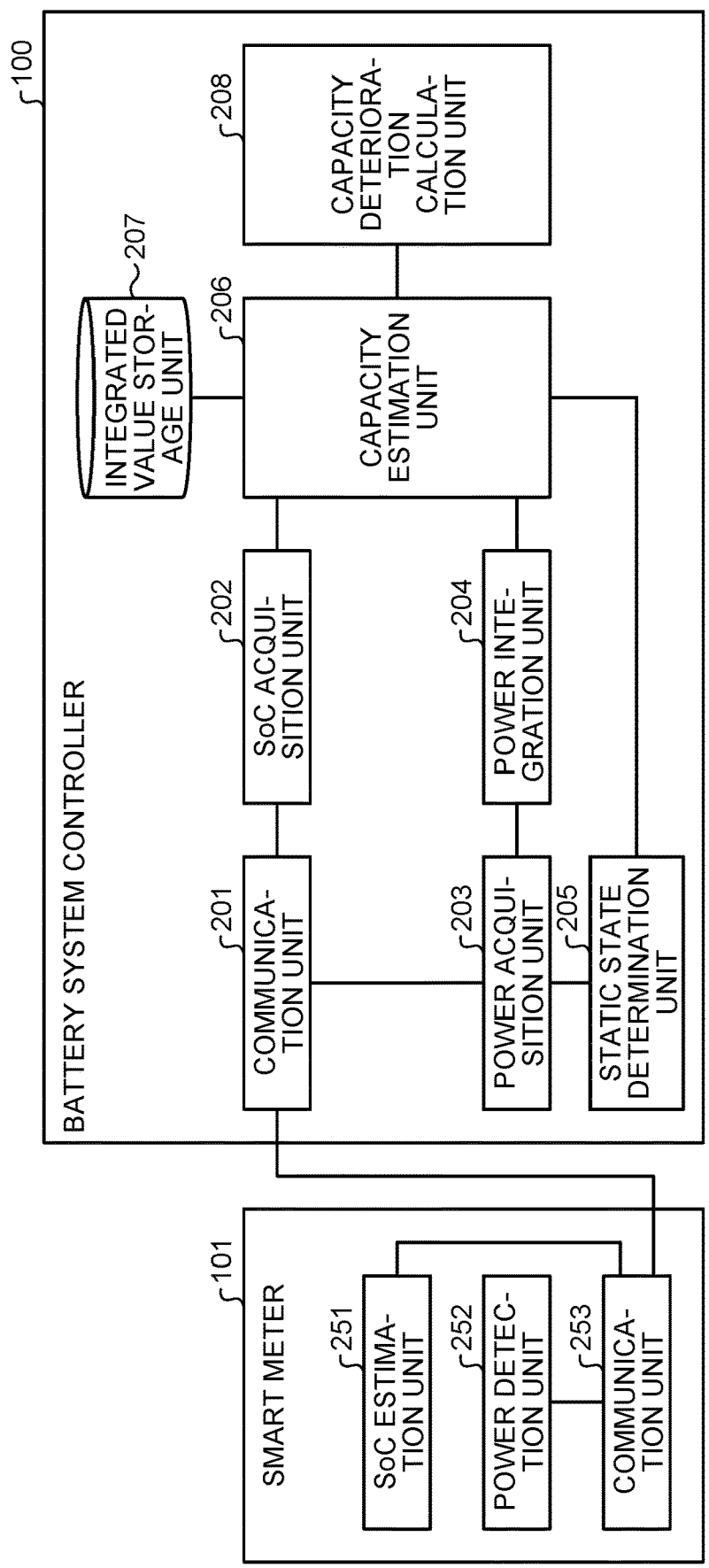
FIG. 2 is a diagram exemplarily illustrating structures of a smart meter and a battery system controller according to the first embodiment.

FIG. 2 is a diagram exemplarily illustrating structures of the smart meter 101 and the battery system controller 100 according to the first embodiment. As illustrated in FIG. 2, the smart meter 101 includes an SoC estimation unit 251, a power detection unit 252, and a communication unit 253.

The SoC estimation unit 251 estimates the SoC of the storage battery system 150 (the battery cells 150_1 to 150_n). Any estimation technique can be used regardless of conventionally proposed techniques. For example, the SoC estimation unit 251 may estimate the SoC based on a cell estimation voltage calculated from open circuit voltages of the battery cells 150_1 to 150_n and an equivalent circuit model on the basis of a current value, a voltage value, and a temperature in the storage battery system 150, or may acquire information about the SoC from the storage battery system 150. Estimation techniques such as a Kalman filter and a table reference technique may be applied to the estimation of the SoC.

The power detection unit 252 detects AC power that is input and output on an AC side of the storage battery system 150 by the current detection device (not illustrated) and the voltage detection device (not illustrated) that are included in the smart meter 101.

The communication unit 253 controls transmission and reception of information between itself and the battery system controller 100. For example, the communication unit 253 transmits the information indicating the SoC of the storage battery system 150 and the detected AC power to the battery system controller 100.

The battery system controller 100 is an information processor that includes a central processing unit (CPU), a read only memory (ROM), a random access memory (RAM), and a hard disk drive (HDD). The CPU of the battery system controller 100 executes a computer program stored in the ROM, thereby achieving a communication unit 201, an SoC acquisition unit 202, a power acquisition unit 203, a power integration unit 204, a static state determination unit 205, a capacity estimation unit 206, and a capacity deterioration calculation unit 208. The battery system controller 100 includes an integrated value storage unit 207 in the HDD.

The communication unit 201 controls transmission and reception of information between itself and other communicable devices (e.g., the smart meter 101). For example, the communication unit 201 receives the information indicating the SoC of the storage battery system 150 and the detected AC power from the smart meter 101.

The SoC acquisition unit 202 acquires the SoC (charged rate) of the storage battery system 150 from the communication unit 201.

The power acquisition unit 203 acquires, from the communication unit 201, the AC power on the AC side, the AC power being input to and output from the storage battery system 150 via the DC-AC converter 102. In the first embodiment, the side where the storage battery system 150 is provided of the DC-AC converter 102 is described as a DC side while the side where the storage battery system 150 is not provided of the DC-AC converter 102 is described as the AC side.

The static state determination unit 205 determines a static period and a variable period of power on the basis of the AC power acquired by the power acquisition unit 203.

The static period in the first embodiment is a period in which an absolute value of a fluctuation range of input power or output power detected by the smart meter 101 is within a certain threshold $\Delta X$. The variable period is a period in which an absolute value of a change amount between the AC power detected by the smart meter 101 in the past (e.g., previous time) and the AC power detected by the smart meter 101 this time is larger than the certain threshold $\Delta X$. The certain threshold $\Delta X$ is set to an appropriate value in accordance with the embodiment, and the description thereof is omitted.

Figure 3:
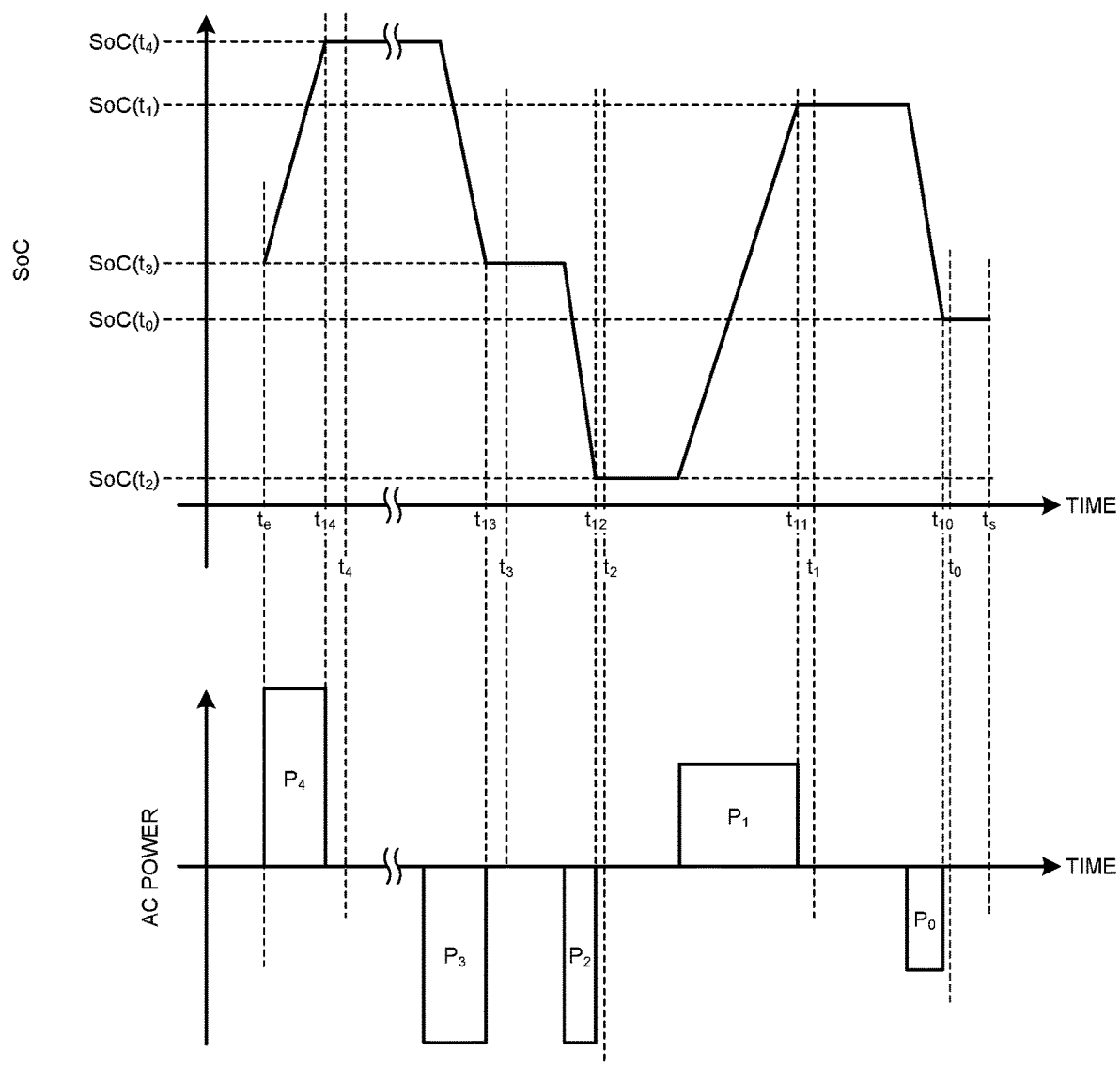
FIG. 3 is a diagram illustrating a state of charge (SoC) changing with the lapse of time and an alternating current (AC) power.

FIG. 3 is a diagram illustrating the SoC changing with the lapse of time and the AC power. In the example illustrated in FIG. 3, the static period is determined at timing of times $t_4$, $t_3$, $t_2$, $t_1$, and $t_0$.

At the time $t_4$, the fluctuation of the power from the time $t_{14}$ is within the certain threshold $\Delta X$, at the time $t_3$, the fluctuation of the power from the time $t_{13}$ is within the certain threshold $\Delta X$, at the time $t_2$, the fluctuation of the power from the time $t_{12}$ is within the certain threshold $\Delta X$, at the time $t_1$, the fluctuation of the power from the time $t_{11}$ is within the certain threshold $\Delta X$, and at the time $t_0$, the fluctuation of the power from the time $t_{10}$ is within the certain threshold $\Delta X$. The static period is thus determined at each timing of times $t_4$, $t_3$, $t_2$, $t_1$, and $t_0$.

In the first embodiment, estimation of the battery capacity starts at a capacity estimation start time $t_s$. The battery capacity is estimated on the basis of the static periods between the capacity estimation start time $t_s$ and the time $t_e$. The time period between the capacity estimation start time $t_s$ and the time $t_e$ is defined as a certain time Y.

In the static period, the power does not fluctuate. The SoC acquired by the SoC acquisition unit 202, thus, keeps a constant value in the static period, thereby making it possible to increase the accuracy of the SoC acquired by the SoC acquisition unit 202.

The power integration unit 204 integrates the AC power that is detected by the smart meter 101 and acquired by the power acquisition unit 203 to calculate a power integrated value. For example, the power integration unit 204 of the first embodiment calculates the power integrated value from the start of measurement of the power to the capacity estimation start time $t_s$ by integrating AC power $P_4$ to $P_0$ illustrated in FIG. 3.

The capacity estimation unit 206 estimates the battery capacity of the storage battery system 150 on the basis of the AC power acquired by the power acquisition unit 203 for each static period and the SoC acquired by the SoC acquisition unit 202 for each static period.

Specifically, the capacity estimation unit 206 acquires a power integrated value $\Sigma P(t_k)$ integrated by the power integration unit 204 until the timing $(t_k)$ and the $SoC(t_k)$ acquired by the power acquisition unit 203 for each timing $(t_k)$ that is determined, by the static state determination unit 205, to be the transition from the variable period to the static period. The capacity estimation unit 206 stores the power integrated value $\Sigma P(t_k)$ integrated until the timing $(t_k)$ and the $SoC(t_k)$ acquired at the timing $(t_k)$ in the integrated value storage unit 207 in association with each other.

The capacity estimation unit 206 of the first embodiment compares the power integrated value $\Sigma P(t_k)$ with the $SoC(t_k)$ that are stored, for each timing $(t_k)$, in the integrated value storage unit 207 within the certain time Y from the capacity estimation start time (e.g., the present time). In the first embodiment, the times $t_0$ to $t_4$, at each of which the static period is determined, are included in the certain time Y. Any time may be set to be the certain time Y. The certain time Y needs to be a time period shorter than at least the time period after which reduction of the battery capacity occurs.

Specifically, for each of the static periods (k=0 to 4) included in the certain time Y, the capacity estimation unit 206 calculates a change amount of the power integrated value between the static periods ($\Delta\Sigma P(t_k)=\Sigma P(t_k)-\Sigma P(t_0)$) on the basis of the power integrated value $\Sigma P(t_k)$ in the static period $(t_k)$ and the $\Sigma P(t_0)$ at the time $t_0$ near the capacity estimation start time (the present time).

Figure 4:
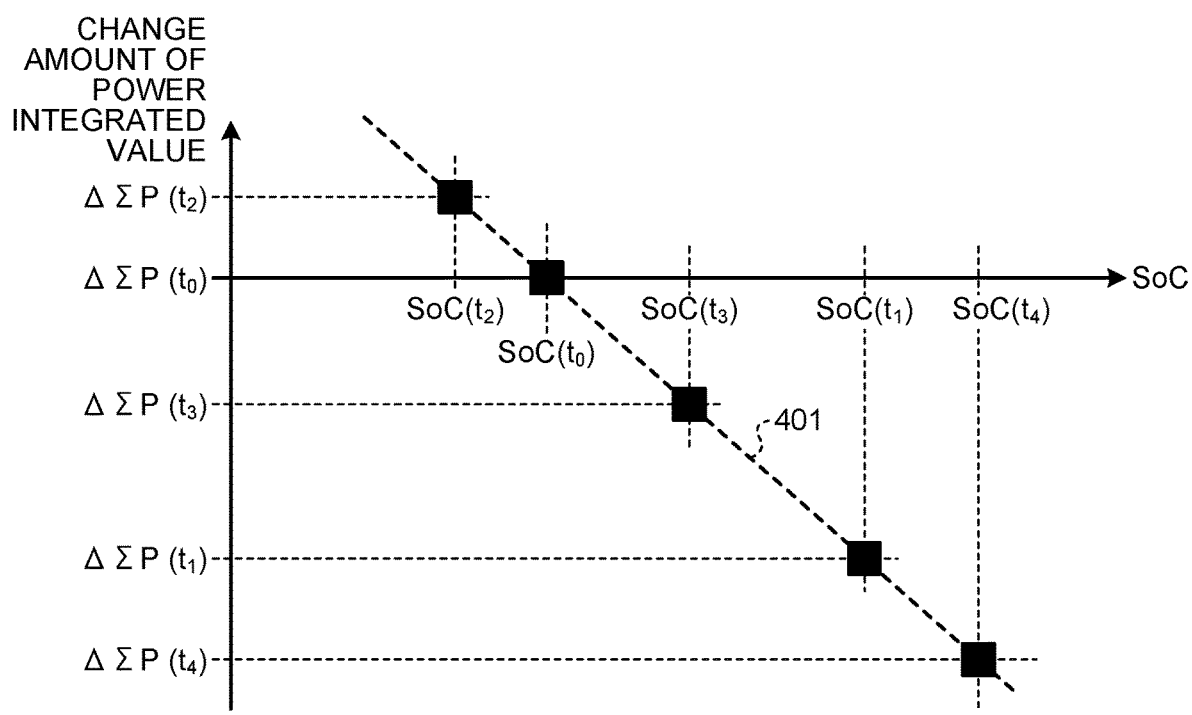
FIG. 4 is a diagram illustrating a change amount of a power integrated value and a change amount of the SoC for each static period on two-dimensional coordinates.

FIG. 4 is a diagram illustrating the change amount of the power integrated value $\Delta\Sigma P(t_k)$ and the $SoC(t_k)$, for each static period, on two-dimensional coordinates. In the example illustrated in FIG. 4, the change amount of the power integrated value $\Delta\Sigma P(t_k)$ and the $SoC(t_k)$ are plotted for each of the times $t_1$ to $t_4$ each of which the static period is determined in the certain time, on the basis of $\Delta\Sigma P(t_0)$ and the $SoC(t_0)$ at the time $t_0$ near the capacity estimation start time (e.g., the present time) as the references. The capacity estimation unit 206 compares the plotted coordinates with one another.

The $SoC(t_k)$, which is a value representing a charged state with respect to a rating capacity, can be represented as SoC=Σ input-output capacity/rating capacity. The change amount of the power integrated value is assumed to be the input-output capacity in the certain time Y. The capacity estimation unit 206 can estimate the battery capacity of the storage battery system 150 from the value obtained by dividing the change amount of the power integrated capacity calculated for each static period by the change amount of the SoC acquired for each static period, because the obtained value corresponding to the rating capacity is, in other words, the battery capacity of the storage battery system 150.

In other words, the value corresponding to the rating capacity is equivalent to a gradient of an approximate curve between the change amount of the power integrated value ($\Sigma P(t_k)-\Sigma P(t_0)$) and the change amount of the SoC ($SoC(t_k)-SoC(t_0)$), which are illustrated in FIG. 4. The battery capacity of the storage battery system 150, thus, can be estimated by deriving the gradient of the approximate curve. The first embodiment does not limit the technique for estimating the battery capacity to the technique that estimates the battery capacity on the basis of the change amount of the power integrated value ($\Sigma P(t_k)-\Sigma P(t_0)$) and the change amount of the SoC ($SoC(t_k)-SoC(t_0)$). For example, the battery capacity may be estimated on the basis of the change amount of the power integrated value ($\Sigma P(t_k)-\Sigma P(t_0)$), and the $SoC(t_k)$ and the $SoC(t_0)$. Any techniques regardless of known techniques may be used as the specific calculation technique.

A further decrease in the gradient of an approximate curve 401 illustrated in FIG. 4 indicates the progress in deterioration of the storage battery system 150.

The capacity estimation unit 206 of the first embodiment estimates the battery capacity of the storage battery system 150 on the basis of the SoC and the AC power that are acquired in the certain time Y from the capacity estimation start time.

The capacity deterioration calculation unit 208 compares the estimated battery capacity with the rating capacity (or a capacity value that can be arbitrarily set) of the storage battery system 150 to estimate a capacity deterioration rate of the storage battery system 150.

Either one or both of the battery capacity estimated by the capacity estimation unit 206 and the capacity deterioration rate estimated by the capacity deterioration calculation unit 208 are notified to an information processing terminal of a storage battery system manager by the communication unit 201. As a result, the storage battery system manager can recognize reduction of the battery capacity or deterioration of capacity.

The notification makes it possible for the storage battery system manager to perform control such that distribution of a charge-discharge command value to the storage battery system 150 is appropriately maintained according to a reduction of the battery capacity. Furthermore, the notification makes it possible for the storage battery system manager to determine whether the storage battery system 150 needs to be maintained or replaced on the basis of either one or both of the notified battery capacity and capacity deterioration rate. As described above, in the first embodiment, the storage battery system manager can recognize the state of the storage battery system 150, thereby making it possible to perform appropriate control.

First Modification of First Embodiment

When any one or more of the photovoltaic (PV) cells 110_1 to 110_n and the auxiliary device 111 is connected to the smart meter 101 via the photovoltaic cell DC-AC converter 112, as illustrated in FIG. 1, the power generated or consumed by any one or more of the photovoltaic (PV) cells 110_1 to 110_n and the auxiliary device 111 has a possibility of being detected by the smart meter 101. In such a case, the power or energy detected by the smart meter 101 has a different value from that charged in or discharged from the storage battery system 150.

The first modification is an example where the battery capacity is estimated in a time zone in which no power is generated by the photovoltaic cells 110_1 to 110_n for the purpose of that the battery capacity is estimated by excluding the influence of the power generated by the photovoltaic cells 110_1 to 110_n.

The capacity estimation unit 206 of the first modification sets the capacity estimation start time on the basis of time information. Specifically, the capacity estimation start time is set such that the measurement time zone is a time zone in which no power is generated by the photovoltaic (PV) cells 110_1 to 110_n, in other words, a time zone in evening or night.

For example, the capacity estimation unit 206 sets the capacity estimation start time to a certain time (e.g., 0 o'clock) at midnight while the capacity estimation unit 206 sets a time the certain time Y (e.g., 6 hours) earlier than the capacity estimation start time to a certain time (e.g., 18 o'clock) in evening at which no power is generated by the photovoltaic cells 110_1 to 110_n.

This setting can achieve the capacity estimation using a value excluding disturbance such as photovoltaic power generation, thereby making it possible to increase estimation accuracy. The setting to limit the time for estimation makes it unnecessary to attach meters to respective devices, thereby making it possible to reduce cost.

Second Modification of First Embodiment

In the first embodiment, the battery capacity is estimated by the capacity estimation unit 206 in the following manner. The change amount of the power integrated amount is calculated between the power integrated amount detected at timing at which the static period is determined near the capacity estimation start time (present time), which serves as the reference, and the power integrated amount detected at each timing of static periods until the certain time Y, thereby estimating the battery capacity. The first embodiment, however, does not limit the calculation technique of the change amount of the power integrated amount to the technique described therein. For example, change amounts of the integrated amount may be calculated between the power integrated amount at the timing at which a certain static period is determined and power integrated amounts at a plurality of timings at which the static period is determined before the certain static period, and the battery capacity may be estimated on the basis of the change amounts.

The second modification is an example where the battery capacity is estimated using the power integrated amount at each timing of the static periods as a reference and the power integrated amounts at timings of the respective static periods before that timing serving as the reference in the certain time Y.

The capacity estimation unit 206 calculates, for each timing ($t_0$) of the static periods, the change amount of the power integrated amount ($\Delta\Sigma P(t_{k0})=\Sigma P(t_{k0})-\Sigma P(t_0)$) (k0=1 to 4) between the power integrated amount at the timing ($t_0$) and the power integrated amount at each timing of the respective static periods before the timing ($t_0$).

The capacity estimation unit 206 calculates, for each timing ($t_1$) of the static periods, the change amount of the power integrated amount ($\Delta\Sigma P(t_{k1})=\Sigma P(t_{k1})-\Sigma P(t_1)$) (k1=2 to 4) between the power integrated amount at the timing ($t_1$) and the power integrated amount at each timing of the respective static periods before the timing ($t_1$).

The capacity estimation unit 206 calculates, for each timing ($t_2$) of the static periods, the change amount of the power integrated amount ($\Delta\Sigma P(t_{k2})=\Sigma P(t_{k2})-\Sigma P(t_2)$) (k2=3 and 4) between the power integrated amount at the timing ($t_2$) and the power integrated amount at each timing of the respective static periods before the timing ($t_2$).

The capacity estimation unit 206 calculates, for each timing ($t_3$) of the static periods, the change amount of the power integrated amount ($\Delta\Sigma P(t_{k3})=\Sigma P(t_{k3})-\Sigma P(t_3)$) (k3=4) between the power integrated amount at the timing ($t_3$) and the power integrated amount at the timing of the static period before the timing ($t_3$).

The capacity estimation unit 206 estimates the battery capacity on the basis of the calculated change amount of the power integrated amount for each timing of the respective static periods and the change amount of the SoC in each corresponding period. The second modification estimates the battery capacity on the basis of the change amounts of power integrated amount and the SoC in a larger number of periods, thereby making it possible to increase estimation accuracy of the battery capacity.

Second Embodiment

In the first embodiment, conversion efficiency of the DC-AC converter 102 is not considered. When the battery capacity of the storage battery system 150 is estimated on the basis of the power detected on the AC side, the efficiency of the DC-AC converter 102 is preferably considered. In a second embodiment, the efficiency of the DC-AC converter 102 is considered.

Figure 5:
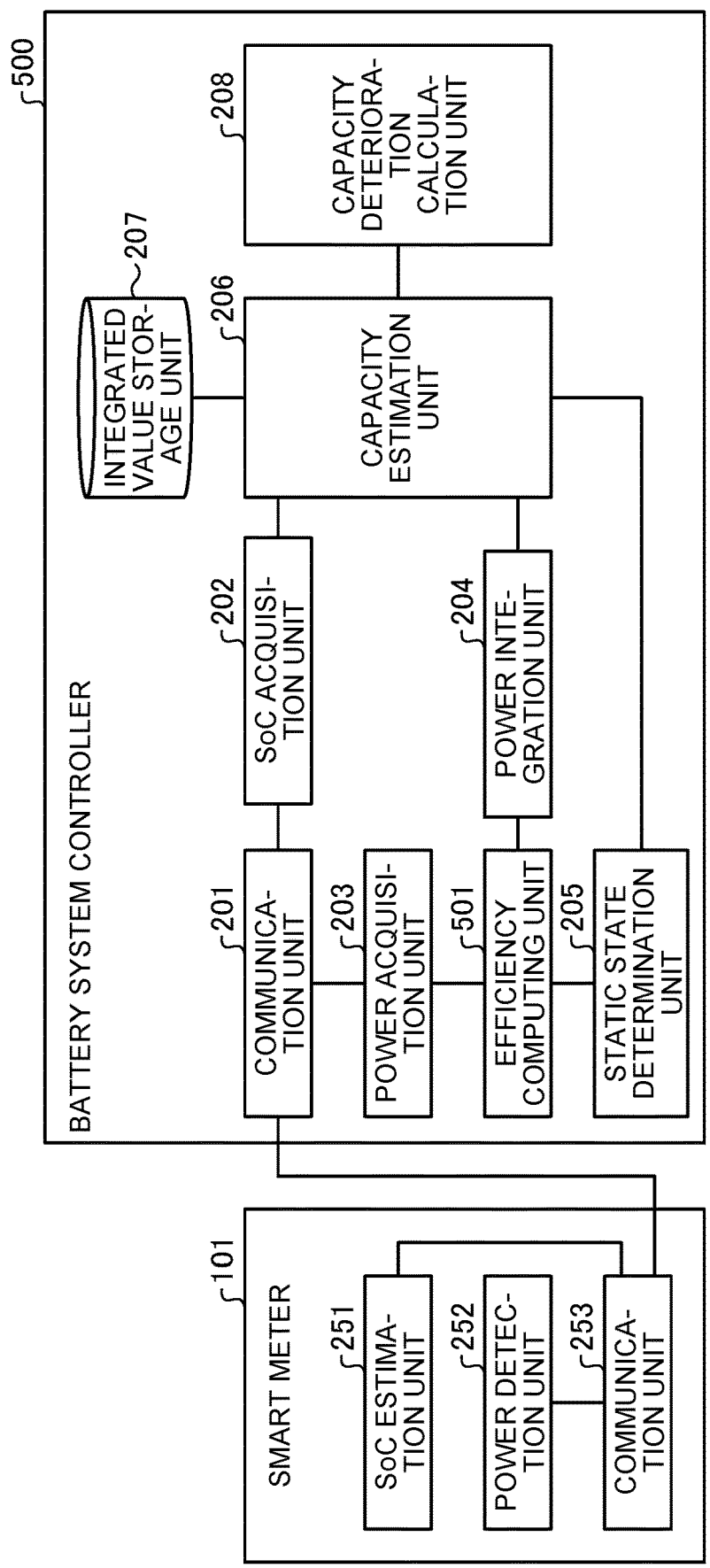
FIG. 5 is a diagram exemplarily illustrating structures of a smart meter and a battery system controller according to a second embodiment.

FIG. 5 is a diagram exemplarily illustrating the structure of the smart meter 101 and a structure of a battery system controller 500 in the second embodiment. The same structures as those described in the first embodiment are labeled with the same numerals and the descriptions thereof are omitted.

The battery system controller 500 is an example where an efficiency computing unit 501 is added to the battery system controller 100 in the first embodiment.

The efficiency computing unit 501 computes information indicating DC power on the DC side of the DC-AC converter 102 on the basis of the conversion efficiency of the DC-AC converter 102 from the information indicating the AC power input from the communication unit 201. The efficiency computing unit 501 is provided with an efficiency conversion table so as to perform computing on the basis of the conversion efficiency.

Figure 6:
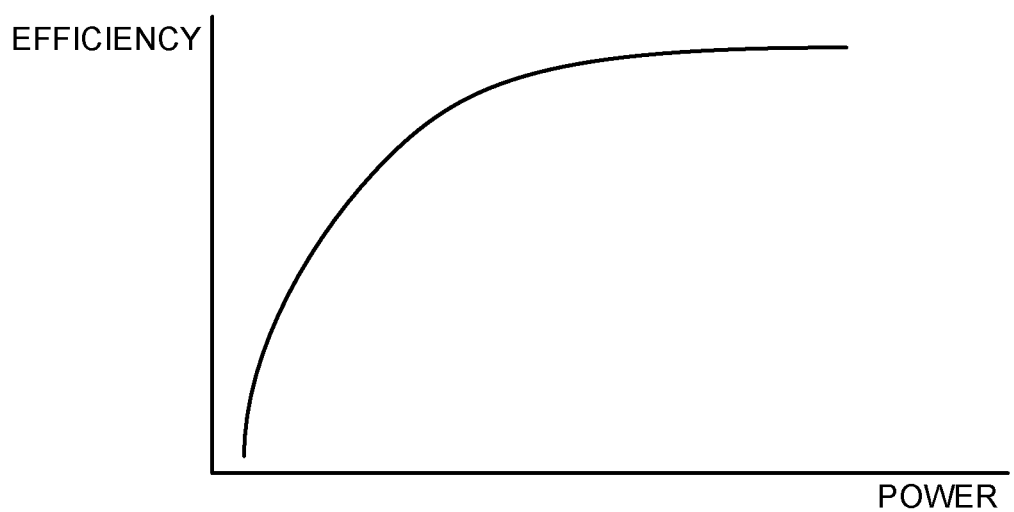
FIG. 6 is a diagram exemplarily illustrating an efficiency conversion table provided in an efficiency computing unit in the second embodiment.

FIG. 6 is a diagram exemplarily illustrating the efficiency conversion table provided in the efficiency computing unit 501 in the second embodiment. As illustrated in FIG. 6, the efficiency computing unit 501 is provided with the efficiency conversion table in which the power and the conversion efficiency value are in association with each other.

In the storage battery system 150, when the conversion efficiency of the DC-AC converter 102 is considered in the charging operation, the capacity charged in the battery cells 150_1 to 150_n on the DC side is smaller than the power integrated amount on the AC side.

When the conversion efficiency of the DC-AC converter 102 is considered in the discharging operation, the power integrated amount on the AC side is smaller than the energy discharged from the battery cells 150_1 to 150_n on the DC side.

On the basis of such a circumstance, the computing technique differs in accordance with the polarities of the input power and output power. The efficiency computing unit 501 is provided with a discharge side efficiency conversion table and a charge side efficiency conversion table, and uses different calculation technique in accordance with the polarities. The efficiency computing unit 501 can appropriately perform power conversion in accordance with whether the charging operation or the discharging operation, and the power.

Figure 7:
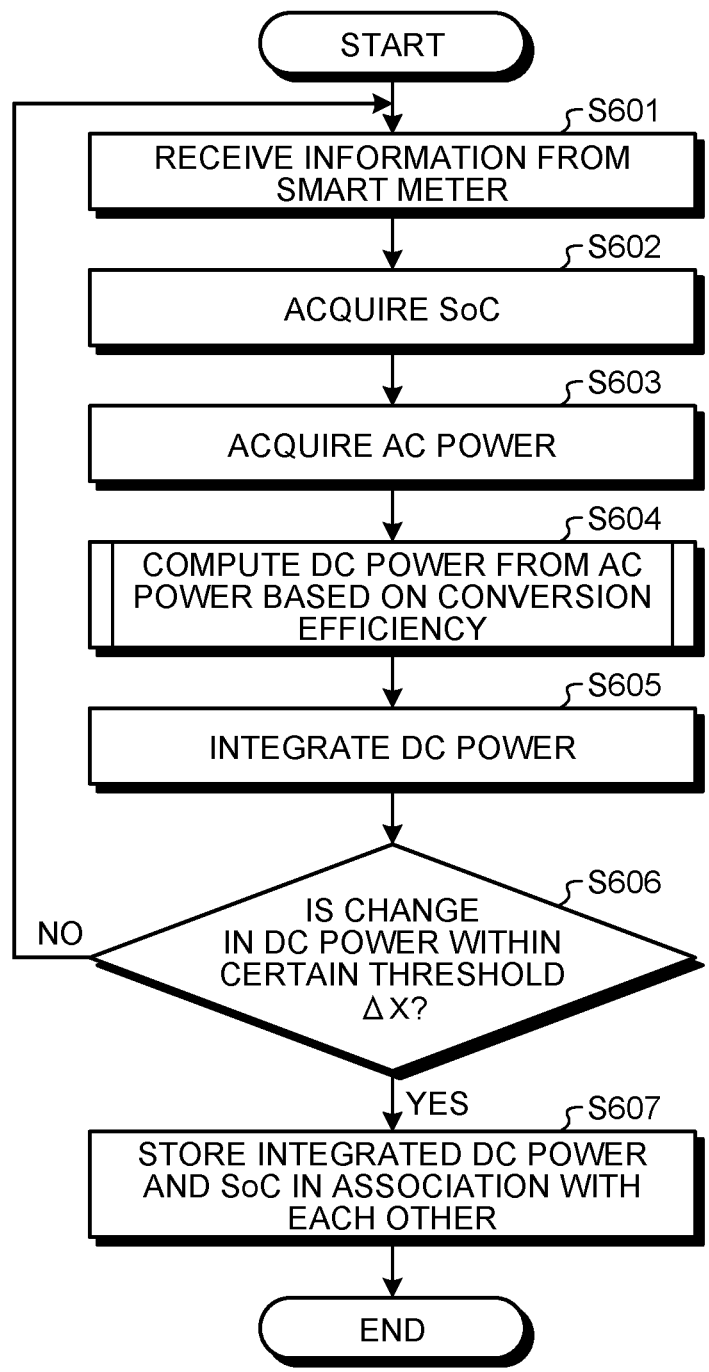
FIG. 7 is a flowchart illustrating processing to store acquired information in an integrated value storage unit of the battery system controller in the second embodiment.

FIG. 7 is a flowchart illustrating processing to store the acquired information in the integrated value storage unit 207 of the battery system controller 500 in the second embodiment.

The communication unit 201 of the battery system controller 500 receives the information about the SoC and the power from the smart meter 101 (S601).

The SoC acquisition unit 202 acquires the SoC from the information received at S601 (S602).

The power acquisition unit 203 acquires the AC power detected by the smart meter 101 from the received information (S603).

The efficiency computing unit 501 acquires the DC power from the AC power on the basis of the conversion efficiency (S604). The specific processing procedure at S604 is described later.

The power integration unit 204 integrates the DC power after the computation by the efficiency computing unit 501 and calculates the DC power integrated amount (S605).

The static state determination unit 205 determines whether the change in DC power (the absolute value of the change amount) after the computation by the efficiency computing unit 501 is within the certain threshold ΔX (S606). If the absolute value of the change amount is not within the certain threshold ΔX, in other words, is larger than the certain threshold ΔX (No at S606), the processing is done again from S601.

If the static state determination unit 205 determines that the change in DC power (the absolute value of the change amount) after the computation by the efficiency computing unit 501 is within the certain threshold ΔX (Yes at S606), the capacity estimation unit 206 stores the DC power integrated amount and the SoC in the integrated value storage unit 207 in association with each other (S607).

Figure 8:
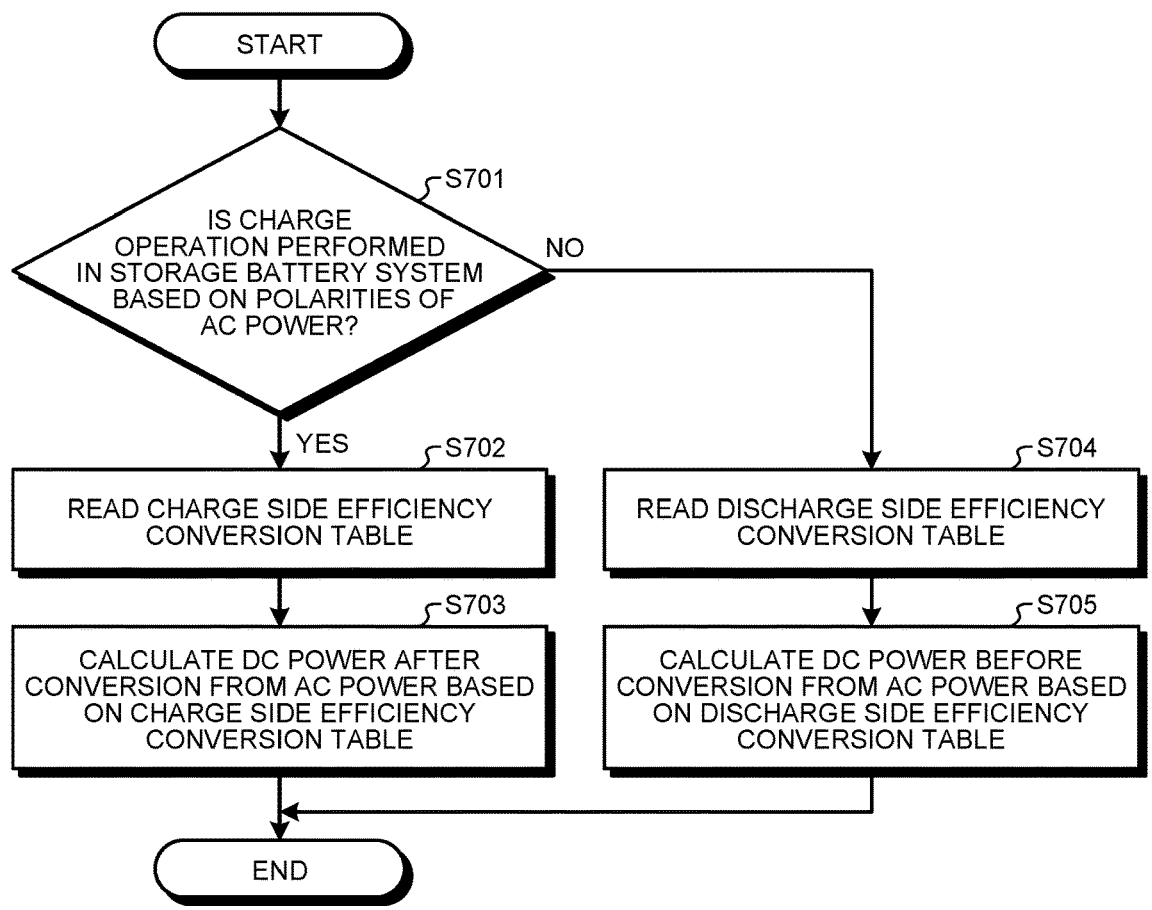
FIG. 8 is a flowchart illustrating a processing procedure to calculate direct current (DC) power by the efficiency computing unit in the second embodiment.

The following specifically describes the processing at S604. FIG. 8 is a flowchart illustrating a processing procedure to calculate the DC power by the efficiency computing unit 501 in the second embodiment.

The efficiency computing unit 501 determines whether the storage battery system 150 is charged on the basis of the polarities of the AC power acquired by the power acquisition unit 203 (S701).

If it is determined that the storage battery system 150 is charged (Yes at S701), the efficiency computing unit 501 reads the charge side efficiency conversion table (S702).

The efficiency computing unit 501 calculates the DC power after the conversion by the DC-AC converter 102 from the power on the AC side on the basis of the read charge side efficiency conversion table (S703). The efficiency computing unit 501 of the second embodiment reads the conversion efficiency value (which is a positive number smaller than one) associated with the AC power from the charge side efficiency conversion table, and multiplies the AC power by the read value, thereby calculating the DC power.

If it is determined that the storage battery system 150 is not charged, in other words, is discharged (No at S701), the efficiency computing unit 501 reads the discharge side efficiency conversion table (S704). The efficiency computing unit 501 of the second embodiment reads the conversion efficiency value (which is a positive number smaller than one) associated with the AC power from the discharge side efficiency conversion table, and divides the AC power by the read value, thereby calculating the DC power.

The efficiency computing unit 501 calculates the DC power before the conversion by the DC-AC converter 102 from the power on the AC side on the basis of the read discharge side efficiency conversion table (S705).

In the second embodiment, integration is performed on the basis of the DC power calculated according to the processing procedure described above, for example.

Figure 9:
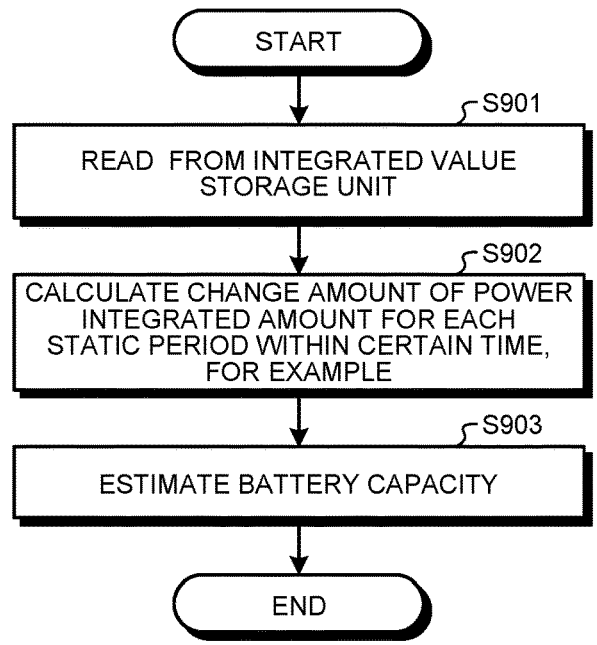
FIG. 9 is a flowchart illustrating a processing procedure to estimate a battery capacity by a capacity estimation unit in the second embodiment.

The following describes the processing to estimate the battery capacity. FIG. 9 is a flowchart illustrating the processing procedure to estimate the battery capacity by the capacity estimation unit 206. The processing illustrated in FIG. 9 is performed from a predetermined capacity estimation start time.

The capacity estimation unit 206 reads the integrated DC power integrated amounts and the SoCs that are stored in the integrated value storage unit 207 within the certain time Y from the capacity estimation start time (S901).

The capacity estimation unit 206 calculates the change amount of the power integrated amount and the change amount of the SoC on the basis of the power integrated amount in the static period near the capacity estimation start time (present time) for each static period within the certain time Y from the capacity estimation start time (S902).

The capacity estimation unit 206 estimates the battery capacity on the basis of the change amount of the power integrated amount and the change amount of the SoC that are calculated for each static period (S903).

In the second embodiment, the battery capacity is estimated by the processing procedure described above. Thereafter, the capacity deterioration rate is estimated by the capacity deterioration calculation unit 208.

In the second embodiment, the conversion efficiency of the DC-AC converter 102 is considered. The second embodiment prevents deviation in the power integrated value (ΣP) due to uneven charge-discharge operation in the variable period occurring when the conversion efficiency of the DC-AC converter 102 is not considered. The second embodiment, thus, can prevent variation of the plots indicated by the change amount of the power integrated amount ΔΣP($t_k$) and the SoC($t_k$) for each static period on the two-dimensional coordinates as illustrated in FIG. 4. In the example illustrated in FIG. 4, an error of the battery capacity calculated from the gradient of the approximate curve can be reduced.

In the second embodiment, the power conversion is performed using the efficiency conversion table as an example. The technique of the power conversion is not limited to one using the efficiency conversion table. The conversion may be performed using a constant (e.g., 0.95), for example. The efficiency conversion tables provided for the respective polarities of the AC power may have the same table values.

In the second embodiment, the DC power that is input in and output from the storage battery system 150 is calculated considering the conversion efficiency. The second embodiment calculates the battery capacity of the storage battery system 150 on the basis of the AC power considering the conversion efficiency of the DC-AC converter 102, thereby making it possible to increase the estimation accuracy of the battery capacity.

Third Embodiment

In the embodiments described above, the power is detected by the smart meter 101. The embodiments described above, however, are not limited to the example where the smart meter 101 detects the power. The smart meter 101 may detect the energy. A third embodiment is an example where the energy is detected.

Figure 10:
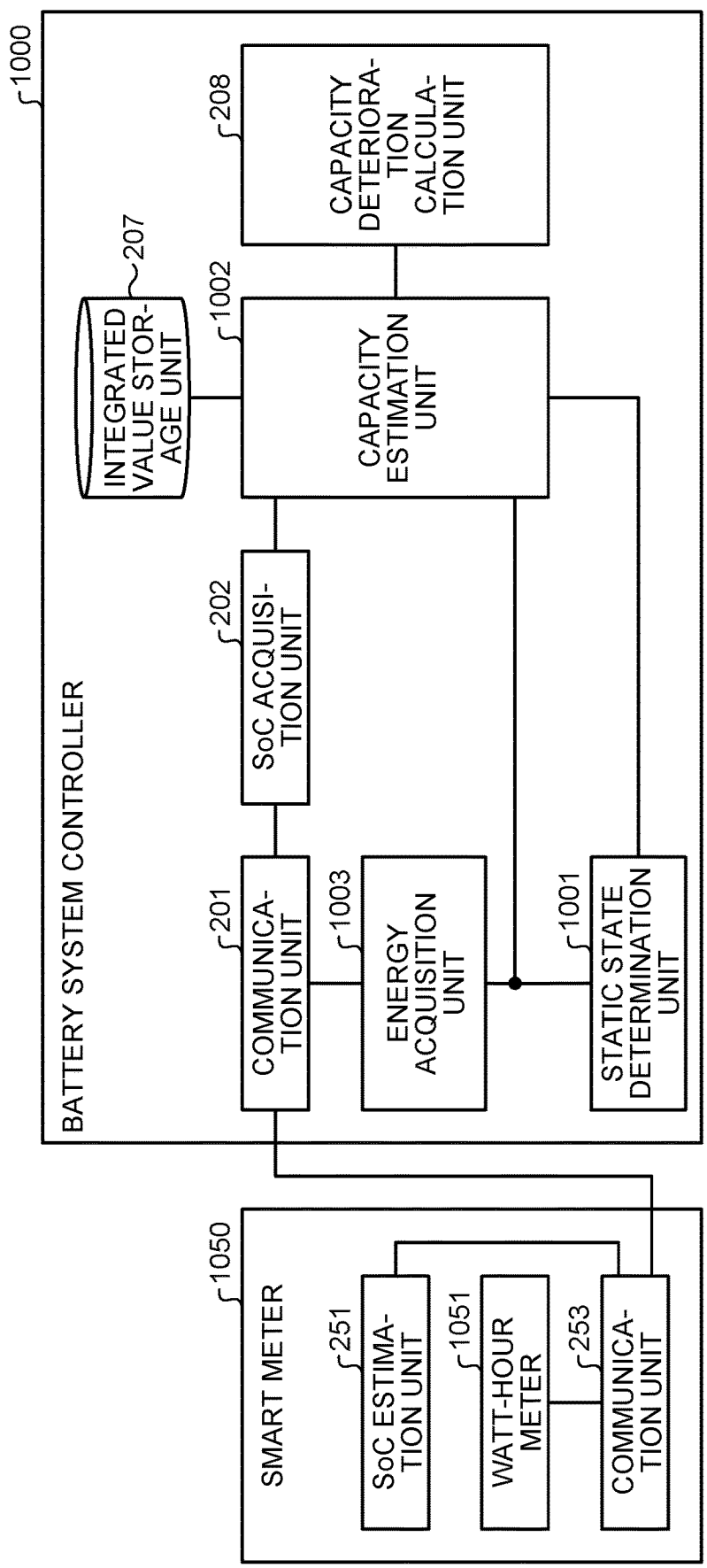
FIG. 10 is a diagram exemplarily illustrating structures of a smart meter and a battery system controller 1000 according to a third embodiment.

FIG. 10 is a diagram exemplarily illustrating structures of a smart meter 1050 and a battery system controller 1000 in the third embodiment. The same structures as those described in the embodiments described above are labeled with the same numerals and descriptions thereof are omitted.

As illustrated in FIG. 10, the smart meter 1050 is provided with a watt-hour meter 1051 instead of the power detection unit 252. The communication unit 253 transmits information indicating the SoC of the storage battery system 150 and the detected AC energy.

The CPU in the battery system controller 1000 executes a computer program stored in the ROM, thereby achieving the communication unit 201, the SoC acquisition unit 202, an energy acquisition unit 1003, a static state determination unit 1001, a capacity estimation unit 1002, and the capacity deterioration calculation unit 208. The battery system controller 1000 includes the integrated value storage unit 207 in the HDD.

The energy acquisition unit 1003 acquires, from the communication unit 201, the AC energy on the AC side, the AC energy being input to and output from the storage battery system 150 via the DC-AC converter 102, for each sampling period T. In the third embodiment, as for the AC energy input for each sampling period, an AC energy input before one sampling time is also described as the previously input AC energy.

The static state determination unit 1001 determines a case to be the static period when the absolute value of a difference between the input AC energy and the previously input AC energy is within a value obtained by multiplying the certain threshold ΔX by T (sampling period). The static state determination unit 1001 determines a case to be the variable period when the absolute value of a difference between the input AC energy and the previously input AC energy is larger than a value obtained by multiplying the certain threshold ΔX by T (time).

When it is determined that the case is the static period, the capacity estimation unit 1002 stores the power integrated amount of the watt-hour meter 1051 at the timing of the static period and the SoC in the integrated value storage unit 207 in association with each other.

At the capacity estimation start time, the capacity estimation unit 1002 subtracts, for each static period, the power integrated amount of the corresponding static period from the power integrated amount of the static period near the capacity estimation start time to calculate a change amount of the power integrated amount. The battery capacity can be calculated in the same manner as the embodiments described above and the descriptions thereof are omitted.

When the power integrated amount in the charge operation and the power integrated amount in the discharge operation are measured by different watt-hour meters in the smart meter 1050, the energy acquisition unit 1003 subtracts the measurement value of the power integrated amount on the discharge side from the measurement value of the power integrated amount on the charge side to calculate the power integrated amount at the timing at which the static period is determined.

The third embodiment, which uses the watt-hour meter 1051, does not need to include a device for detecting the power and the power integration processing. The third embodiment can achieve reduction of estimation processing time of the battery capacity and reduction of load in the battery system controller 1000.

Modification of Third Embodiment

The third embodiment is an example where whether the static period is determined on the basis of the energy when the energy is acquired. The third embodiment is, however, not limited to the technique that determines whether the static period on the basis of the energy even when the energy is acquired.

Figure 11:
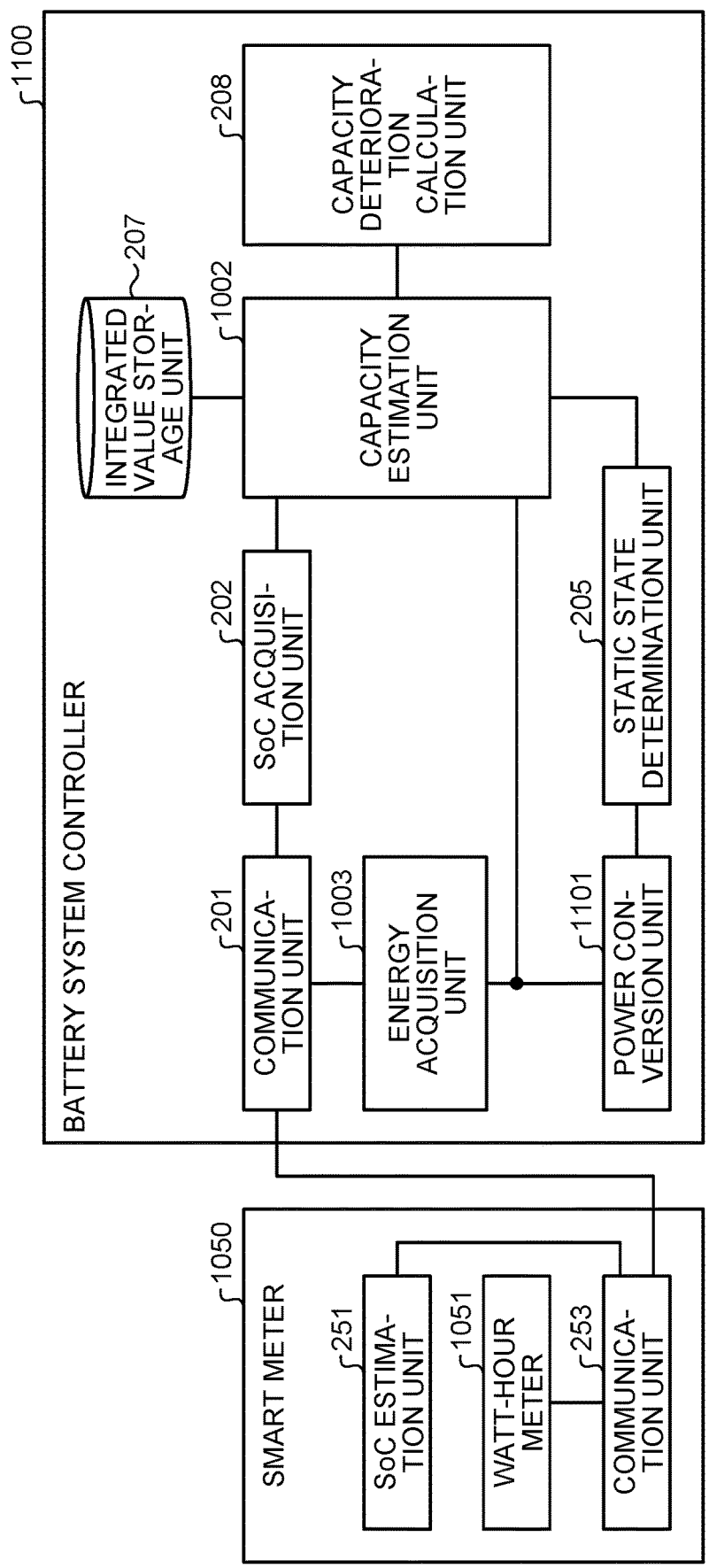
FIG. 11 is a diagram exemplarily illustrating structures of the smart meter and a battery system controller 1100 according to a modification of the third embodiment.

FIG. 11 is a diagram exemplarily illustrating structures of the smart meter 1050 and a battery system controller 1100 in a modification of the third embodiment. The same structures as those described in the embodiments described above are labeled with the same numerals and descriptions thereof are omitted.

The CPU of the battery system controller 1100 executes a computer program stored in the ROM, thereby achieving the communication unit 201, the SoC acquisition unit 202, an energy acquisition unit 1003, a power conversion unit 1101, the static state determination unit 205, a capacity estimation unit 1002, and the capacity deterioration calculation unit 208. The battery system controller 1000 includes the integrated value storage unit 207 in the HDD.

In the modification, the power conversion unit 1101 calculates a value converted into power from the energy acquired by the energy acquisition unit 1003. The value converted into power is calculated on the basis of the energy and the sampling period T.

The static state determination unit 205 determines the static period in accordance with whether the absolute value of the value converted into power is within the certain threshold ΔX in the same manner as the first embodiment. The processing followed by that described above is the same as that in the third embodiment, and the description thereof is omitted.

Fourth Embodiment

The third embodiment is an example where the efficiency of the power conversion is not considered. In a fourth embodiment, the efficiency of power conversion is considered when the energy is acquired.

Figure 12:
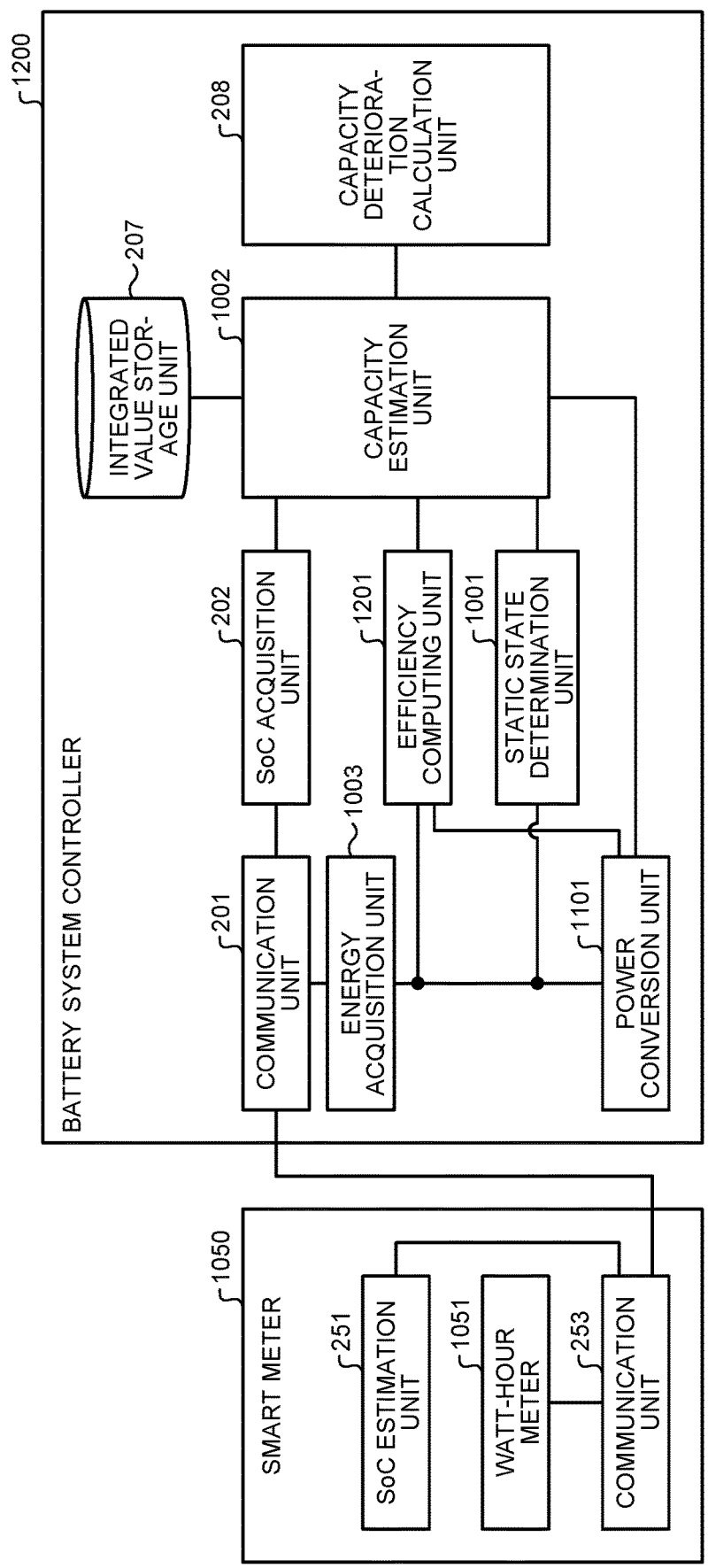
FIG. 12 is a diagram exemplarily illustrating structures of the smart meter and a battery system controller according to a fourth embodiment.

FIG. 12 is a diagram exemplarily illustrating structures of the smart meter 1050 and a battery system controller 1200 in the fourth embodiment. The same structures as those described in the embodiments described above are labeled with the same numerals and descriptions thereof are omitted.

The CPU of the battery system controller 1200 executes a computer program stored in the ROM, thereby achieving the communication unit 201, the SoC acquisition unit 202, the energy acquisition unit 1003, the static state determination unit 1001, the power conversion unit 1101, an efficiency computing unit 1201, the capacity estimation unit 1002, and the capacity deterioration calculation unit 208. The battery system controller 1200 includes the integrated value storage unit 207 in the HDD.

The efficiency computing unit 1201 can calculate the DC power in the charge operation by multiplying the AC energy by the conversion efficiency value corresponding to the charge operation.

The efficiency computing unit 1201 can calculate the DC power in the discharging operation by dividing the AC energy by the conversion efficiency value corresponding to the discharge operation.

The capacity estimation unit 1002 stores the DC power integrated amount and the SoC in the integrated value storage unit 207 in association with each other.

In the fourth embodiment, a predetermined conversion efficiency value is used because the watt-hour meter cannot acquire power output instantaneously. The fourth embodiment is, however, not limited to use of such a technique. For example, the efficiency computing unit 1201 may calculate the DC power integrated amount using any one or more of the value converted into power by the power conversion unit 1101 from the AC energy, and the discharge efficiency conversion table and the charge efficiency conversion table that are described in the second embodiment.

In the fourth embodiment, the static state determination unit 1001 determines whether the static period on the basis of the energy. The power conversion unit 1101 may determine whether the static period on the basis of the absolute value of the value converted into power.

Fifth Embodiment

The embodiments and the modifications described above are examples where the battery capacity and the capacity deterioration rate of the storage battery system 150 are calculated by the battery system controller. All processing is not limited to being performed by the battery system controller. All processing may be achieved by a combination of a plurality of devices.

FIG. 13 is a diagram exemplarily illustrating a structure of a power control system according to a fifth embodiment. In the example illustrated in FIG. 13, a battery system controller 1300 is connected to an upper controller 1351. The battery system controller 1300 is connected to a remote controller 1352 via a public network 1350. The calculation techniques of the battery capacity and the capacity deterioration rate may be those used in the embodiments and modifications described above, and the descriptions thereof are omitted.

For example, the battery system controller 1300 is provided for each battery system controller 150, the upper controller 1351 manages the multiple battery system controllers 150, and the remote controller 1352 manages all of the battery system controllers 150 provided in a certain region and collects information from the battery system controllers 150.

In such a case, the battery system controller 1300 is not limited to calculation of the battery capacity and the capacity deterioration rate. For example, the battery system controller 1300 may transmit information about the power or the energy and the SoC to the upper controller 1351 or the remote controller 1352, and the upper controller 1351 or the remote controller 1352 may calculate the battery capacity and the capacity deterioration rate.

Sixth Embodiment

The fifth embodiment is an example where the upper controller 1351 or the remote controller 1352 calculates the battery capacity and the capacity deterioration rate. The calculation of the battery capacity and the calculation of the capacity deterioration rate may be performed by different devices.

For example, the battery system controller 1300 calculates the power capacity and transmits the calculated power capacity to the upper controller 1351 or the remote controller 1352. The capacity deterioration calculation unit 208 included in the upper controller 1351 or the remote controller 1352 may calculate the capacity deterioration rate on the basis of the information from the battery system controller 1300.

The battery system controller 1300 may transmit the estimation result of the battery capacity to a data storage device that stores therein the information transmitted from the battery system controller 1300 and a measurement data analysis device that analyzes the battery capacity calculated by the battery system controller 1300.

In the sixth embodiment, the battery system controller 1300 transmits the estimation result of the battery capacity to the upper controller 1351 or the remote controller 1352, thereby making it possible to appropriately manage and control the charge and discharge amounts of each battery system controller 150.

The embodiments and the modifications described above explain the technique that calculates the battery capacity on the basis of the SoCs acquired in the static periods. The timing at which the SoC used for calculating the battery capacity is acquired is not limited to the static period. The timing may be the variable period when the SoC can be appropriately acquired.

In the embodiments and the modifications described above, the battery capacity of the storage battery system 150 is estimated from the AC power or the AC energy via the DC-AC converter 102 without acquiring the DC power or the DC energy that is directly input to and output from the storage battery system 150. The embodiments and the modifications described above allow the battery capacity to be estimated without newly providing a device that detects the power of the storage battery system 150, thereby making it possible to achieve appropriate control of the storage battery system 150. Either one or both of the capacity and the capacity deterioration of the storage battery system 150 are estimated on the basis of the AC power or the AC energy that is easily acquired by the power business operator, for example. As a result, no device needs to be provided that detects the power directly from the storage battery system 150, thereby making it possible to reduce cost.

The invention has an advantageous effect of capable of appropriately estimating the battery capacity of the storage battery system without acquiring the DC power or the DC energy that is directly input to and output from the storage battery system, for example.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A battery capacity estimation device comprising:
one or more hardware processors configured to:
acquire an alternating current power or an alternating current energy that is input to and output from a storage battery system via a direct current-alternating current converter, the storage battery system being capable of controlling charge and discharge;
acquire a state of charge (SoC) of the storage battery system;
determine whether a change in power in the storage battery system is equal to or smaller than a certain threshold based on the acquired alternating current power or the acquired alternating current energy; and
estimate a battery capacity of the storage battery system based on alternating current power or alternating current energy and SoCs acquired at a plurality of timings at which the change in power is determined to be equal to or smaller than the certain threshold.

2. The battery capacity estimation device according to claim 1, wherein the one or more hardware processors are further configured to estimate the battery capacity of the storage battery system based on: a change amount between the alternating current power or the alternating current energy at a latest timing and another timing out of the timings; and the SoCs at the latest timing and the other timing, or a change amount between the SoCs at the latest timing and the other timing.

3. The battery capacity estimation device according to claim 1, wherein the one or more hardware processors are further configured to:

compute: a direct current power or a direct current energy output from the storage battery system before being converted by the direct current-alternating current converter; and a direct current power or a direct current energy input to the storage battery system after being converted by the direct current-alternating current converter, based on the acquired alternating current power or the acquired alternating current energy and conversion efficiency information about conversion between a direct current and an alternating current of the direct current-alternating current converter; and estimate the battery capacity of the storage battery system based on the computed direct current power or the computed direct current energy and the acquired SoC.

4. The battery capacity estimation device according to claim 1, wherein, when the acquired alternating current power or the acquired alternating current energy includes a power or an energy output from a photovoltaic cell, the one or more hardware processors are further configured to estimate the battery capacity of the storage battery system based on the power or the energy and the SoC acquired in a time zone in which no generation is performed by the photovoltaic cell.

5. A battery capacity estimation method that is performed by a battery capacity estimation device, the battery capacity estimation method comprising:

acquiring an alternating current power or an alternating current energy that is input to and output from a storage battery system via a direct current-alternating current converter, the storage battery system being capable of controlling charge and discharge;

acquiring a state of charge (SoC) of the storage battery system;

determining whether a change in power in the storage battery system is equal to or smaller than a certain threshold based on the acquired alternating current power or the acquired alternating current energy; and estimating a battery capacity of the storage battery system based on alternating current power or alternating current energy and SoCs acquired at a plurality of timings at which the change in power is determined to be equal to or smaller than the certain threshold.

6. A computer program product including programmed instructions embodied in and stored on a non-transitory computer readable medium, wherein the instructions, when executed by a computer, cause the computer to perform:

acquiring alternating current power or an alternating current energy that is input to and output from a storage battery system via a direct current-alternating current converter, the storage battery system being capable of controlling charge and discharge;

acquiring a state of charge (SoC) of the storage battery system;

determining whether a change in power in the storage battery system is equal to or smaller than a certain threshold based on the acquired alternating current power or the acquired alternating current energy; and estimating a battery capacity of the storage battery system based on alternating current power or alternating current energy and SoCs acquired at a plurality of timings at which the change in power is determined to be equal to or smaller than the certain threshold.

* * * * *